United States Patent
Wareberg et al.

(10) Patent No.: US 6,867,795 B1
(45) Date of Patent: Mar. 15, 2005

(54) OPTICAL ARRAY WITH IMPROVED CONTACT STRUCTURE

(75) Inventors: P. Gunnar Wareberg, Cumberland; David I. Kennedy, Ottawa; Richard Woodfield, Almonte, all of (CA)

(73) Assignee: Optotek Ltd., Kanata (CA)

( * ) Notice: Subject to any disclaimer, the term of this patent is extended or adjusted under 35 U.S.C. 154(b) by 479 days.

(21) Appl. No.: 09/625,973

(22) Filed: Jul. 26, 2000

(51) Int. Cl.⁷ .................. B41J 2/385; H01L 33/00
(52) U.S. Cl. .................. 347/238; 347/119; 257/81
(58) Field of Search .................. 347/130, 118, 347/238, 119; 257/81, 82, 84, 88, 99

(56) References Cited

U.S. PATENT DOCUMENTS

| | | | |
|---|---|---|---|
| 5,177,500 A | | 1/1993 | Ng et al. .................. 347/245 |
| 5,192,958 A | | 3/1993 | Charnitski .................. 347/242 |
| 5,557,115 A | * | 9/1996 | Shakuda .................. 257/81 |
| 5,751,327 A | * | 5/1998 | De Cock et al. .................. 347/130 |
| 5,793,405 A | * | 8/1998 | Shakuda .................. 347/238 |

* cited by examiner

Primary Examiner—Hai Pham
(74) Attorney, Agent, or Firm—Marks & Clerk

(57) ABSTRACT

A high density array of light emitting diodes for visual display and imaging purposes. The array is mounted on a thermally and electrically conducting medium such as an aluminum block. The block, in one embodiment, is configured to permit a supplementary cooling liquid to be circulated through it. Typically, such LED arrays are fabricated by forming a plurality of p-type islands in n-type host semiconductor material. Each p-type island has an individually addressable contact and a common n-type contact is made to the aluminum block by, for example an electrically conductive epoxy. In operation the connection between the carrier and array may be lost due to a temperature differential between the two components. The present invention avoids this problem by providing a separate connection in parallel with or in place of the common n-type contact.

10 Claims, 2 Drawing Sheets

OPTICAL ARRAY WITH IMPROVED CONTACT STRUCTURE

FIELD OF THE INVENTION

This invention relates to light emitting diode (LED) arrays and more particularly to contact structures for high density LED arrays used in optical displays and imaging printheads.

BACKGROUND

Optical arrays including, but not limited to, high resolution, linear arrays are frequently used in such applications as visual displays and recording printheads. These arrays are typically fabricated from compound semiconductor materials including certain III–V compounds. The GaAs/$GaAs_xP_{1-x}$ combination is typical of such compounds. Light-emitting diode arrays as contemplated by the present invention comprise a plurality of small, closely spaced planar diffused islands of a first conductivity type, for example p-type, in a second conductivity type (n) material. The starting material for such arrays typically comprises a GaAs, n-type substrate on which is deposited an epitaxial layer of n-type $GaAs_xP_{1-x}$ material. The individual light-emitting devices are formed by, for example, diffusing p-type material through windows formed in a dielectric layer grown on top of the epitaxial layer. Individual metal contacts such as aluminum are provided to the p-type material utilizing known evaporation techniques, the material being etched into individually addressable stripes with photolithographic processes which are well known and described in the literature.

Typically, the bottom face of the substrate (n-type) is a common connection for the array. By selectively energizing individual devices, an optical pattern can be developed for visual display purposes or for annotating or marking suitable photoreceptor material.

High density linear arrays such as might be used for recording printheads, are known to have a linear density in excess of 300 active devices per inch. In operation, many of these devices will be activated at the same time and the energy dissipated by the current flowing through multiple devices can lead to an increased temperature of the array. This increase in array temperature causes decreased output radiation with the decrease being approximately 1% per ° C.

As discussed previously, the back face or n side common contact is required to provide the return path for the activation current in a typical and previously described structure. In order to reduce thermal effects, it is known to mount such linear arrays on carriers that have good thermal characteristics. For example, aluminum blocks are commonly used as a mounting medium.

U.S. Pat. No. 5,192,958 which issued Mar. 9, 1993 to Chamitski discloses a metal carrier for an LED printhead in which liquid coolant is used to further decrease the temperature of the active devices.

U.S. Pat. No. 5,177,500 which issued Jan. 5, 1993 to Ng is also concerned with the thermal effects of operating a high density array, but this patent relates to the equalization of thermal effects between adjacent arrays.

One of the complications of utilizing a liquid cooled carrier, is that the thermal differential between the semiconductor substrate having relatively poor thermal conductivity and the cooled array carrier can lead to electrical connectivity problems between the two elements. The difference in thermal coefficients, under certain operating conditions, can cause a complete or partial breakdown of the electrical connection between the substrate and carrier. One of the common methods of mounting such arrays onto a carrier is to use conductive epoxies. These epoxies, under the above described operating conditions, are known to break down resulting in loss of optical output of the array. In other less catastrophic situations, the conductivity between the elements is decreased resulting in reduced optical output of the array.

The present invention provides a system and method for improving electrical and thermal characteristics of a high density LED array.

SUMMARY OF THE INVENTION

This invention eliminates the reliance on conductive epoxy for making the common cathode connection to the carrier of a monolithic LED array having a large number of diodes. One or more ohmic n type contacts are added to the top surface thereby allowing a common cathode connection to the carrier to be made with bond wires. Eliminating the need for a conductive epoxy also allows use of adhesives with better thermal characteristics for mechanically securing the LED array to the carrier.

It is an object of the present invention to provide a method of improving the electrical and thermal conductivities of a monolithic light-emitting diode (LED) array by making both anode and cathode connections from the top surface to the underlining carrier using bondwires, thereby eliminating reliance on conductive epoxy or other adhesive to form the common electrical connection on the base of the LED material adjacent to the carrier.

It is further object of the present invention to provide a contact structure that ensures good electrical connections to a high density LED array operating at high power levels.

Therefore, in accordance with a first aspect of the present invention there is provided a method of improving electrical and thermal conductivities of a monolithic light-emitting diode (LED) array mounted on a conductive carrier, the method comprising providing both anode and cathode connections from a top surface of the array, the cathode connection including a bond wire to the carrier.

In accordance with a second aspect of the present invention there is provided a high density optical array comprising: a plurality of light emitting diodes formed by diffused regions of a first conductivity type in a top surface of a layer of semi-conducting material of a second conductivity type; individual electrical contacts to the diffused regions of the first conductivity type; a conductive mounting carrier; attachment means to connect a bottom surface of the layer of the second conductivity type material to the carrier; at least one ohmic contact on the top surface of the layer of the second conductivity material; and a bond wire from the ohmic contact to the mounting carrier.

In a preferred embodiment of this aspect of the invention, the first conductivity type is p-type material and the second conductivity type is n-type material.

According to a further aspect of the present invention there is provided a method of controlling electrical and thermal characteristics of a high density LED printhead comprising: providing a linear array of surface emitting LEDs having individual p-type electrical contacts to the devices; mounting the linear array on a thermally conductive carrier; and providing an n-type contact on the surface emitting face, the n-type contact connected to the carrier by a bond wire.

BRIEF DESCRIPTION OF THE DRAWINGS

This invention will now be described in greater detail with reference to the attached drawings wherein.

DETAILED DESCRIPTION OF THE INVENTION

Figure 1:
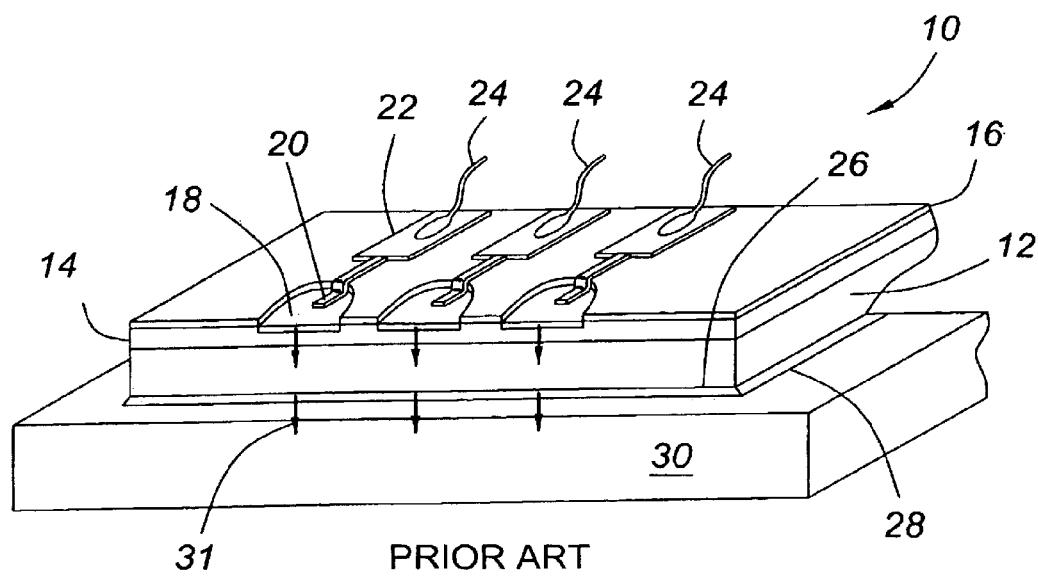
FIG. 1 illustrates a portion of an array according to the prior art.

FIG. 1 is a perspective view of a conventional high density LED array. The array 10 includes a semiconductor substrate 12 which in a preferred embodiment is GaAs on which is grown, by known methods, an epitaxial layer 14 of $GaAs_xP_{1-x}$. In a preferred embodiment, the substrate 12 and the epitaxial layer 14 are n-type material. In processing the material to form light emitting devices, a dielectric layer 16 such as $Si_3N_4$ is deposited on the top surface of the epitaxial layer. The surface of the dielectric is patterned using well known photlithographical processes and then etched to selectively remove the dielectric from areas where p-n junctions are to be created. Techniques such as thermal diffusion or an implantation are then used to form the p-type islands 18 in the n-type epitaxial layer.

A metal layer of, for example aluminum, is deposited on the dielectric layer and into the windows. Photolithographic techniques are again used to pattern the metal layer which is then etched to form individual contacts 20. Contacts 20 each have an enlarged bonding pad 22 to which an aluminum bonding wire from an energizing circuit (not shown) is attached for use in energizing individual devices.

In a conventional LED, the bottom face 26 of the substrate 12 has a common n-type contact, and the array is electrically and physically connected to a carrier 30 using, for example, electrically conducting epoxy 28.

As illustrated in FIG. 1, by way of arrows 31, activation energy for each diode 18 passes from contact 20 through the substrate 12, the back contact 26, epoxy 28, and to the carrier 30. This activation energy, particularly in high density arrays, can generate considerable heating effects which, as discussed previously, can reduce the optical output of diodes 18.

The improvement provided by the present invention will now be described in conjunction with FIG. 2. Elements common with those shown in FIG. 1 bear the same reference numerals.

Figure 2:
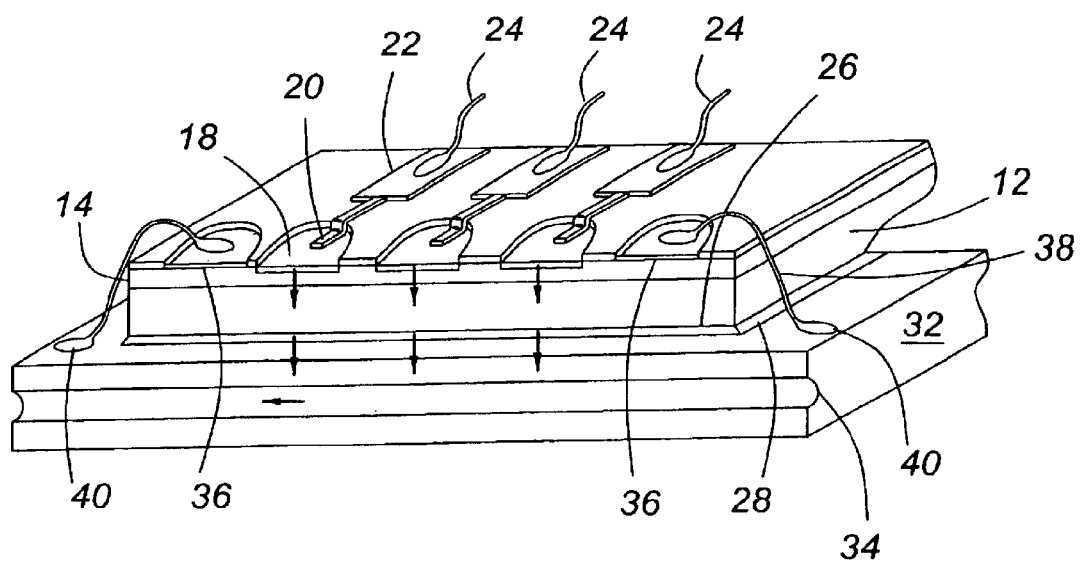
FIG. 2 illustrates a portion of an LED array processed in accordance with the present invention.

In the embodiment shown in FIG. 2 the metal carrier 32 is provided with passage(s) 34 for transferring a cooling substance such as a liquid through block 32. This cooling substance helps to reduce the operating temperature of the linear array, thereby reducing the thermal effects discussed previously. It is to be understood, however, that the benefits provided by the present invention are equally applicable to arrays mounted on conventional carriers and ceramic substrates.

One of the side effects of cooling the carrier 30 or 32, is that a considerable temperature differential can exist between the carrier and the active devices 18. Typically the semiconductor substrate does not transfer heat as well as the metal carrier and as a result, a temperature difference can exist between the substrate and the carrier 32. This temperature differential, in the extreme case, can result in de-lamination of the contact material 28 with the concomitant loss of electrical continuity between the common contact on the substrate and the carrier 30, 32.

The present invention overcomes this limitation by providing one or more ohmic contacts 36 to the top, n-type surface of the epitaxial layer. These contacts are prepared by depositing material such as Au/Ge/Ni into windows etched in the top dielectric layer followed by a sintering step. Bond wires 38 are then connected from the n-type contacts 36 to the carrier 32 at bond location 40. In one embodiment of the invention the wire bond connection from the top n-type layer to the carrier is used in parallel with the traditional common cathode structure using conductive epoxy or a solder eutectic 28 in order to provide redundancy. Alternatively, the n-contact is provided solely by the bond wires 38 in which case a different attachment material such as an epoxy having superior thermal and adhesive characteristics can be used to hold the array to the carrier 32.

Though the conductivity of the n-type layer is generally high enough to provide good electrical characteristics between one or more n-type pads 36 and diodes 18, in a further embodiment the upper surface may have a layer of high conductivity material immediately under the dielectric layer in order to improve current spreading.

It is also to be understood that carrier 32, in a preferred embodiment includes a liquid cooling passage, but the concept of providing a top n-contact to a LED array can be used in other applications as well.

Figure 3:
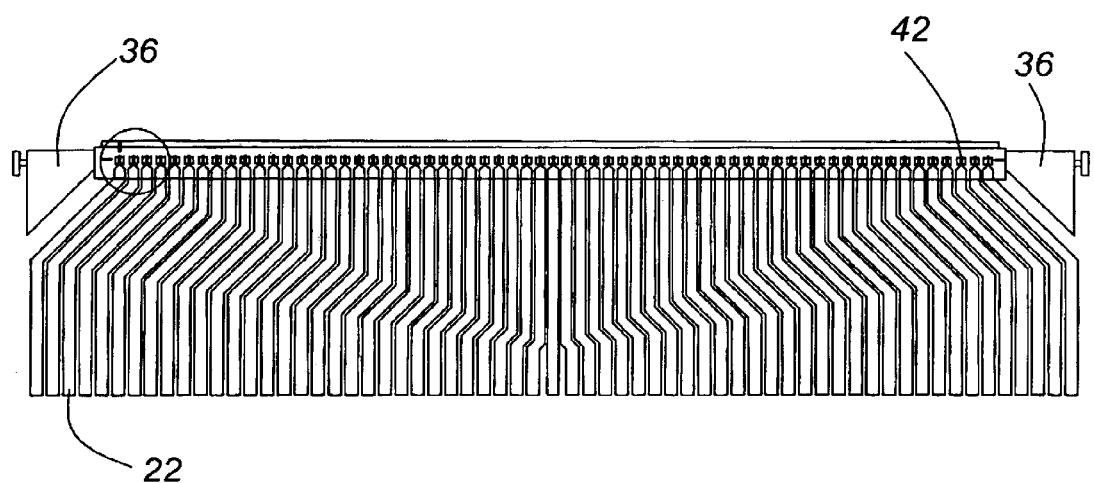
FIG. 3 is a top view of a high density LED array according to the present invention.
Figure 3A:
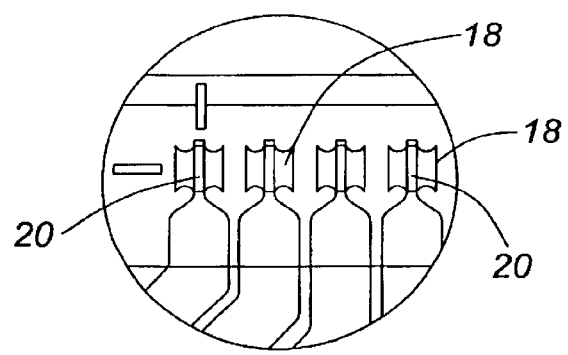
FIG. 3a is an enlarged view of a portion of the array of FIG. 3.

FIG. 3 illustrates a top view of a light emitting diode array including p-contacts 20 and bonding area 22 as well as the n-contact window 36. As shown in FIG. 3a, which is an enlarged view of a portion of FIG. 3, the active area 18 has p-contacts 20 formed thereon. In FIG. 3, the rectangular outline 42 represents an anti-reflecting coating provided over the LED devices.

While particular embodiments of the invention have been described and illustrated, it will be apparent to one skilled in the art that numerous changes can be made to the concept. It is to be understood, however, that such changes will fall within the true scope of the invention as defined by the appended claims.

What is claimed is:

1. A method of improving the electrical conductivity of a high density monolithic array of light emitting diodes, wherein the array, have a common cathode on a back face and a plurality of individually addressable p-n junctions on a top face, is mounted directly on a cooled metal carrier, the method comprising:

attaching the common cathode of the array to the metal carrier using a thermally conductive medium;

providing individual contacts to said individually addressable p-n junctions; and attaching at least one bond wire from a cathode terminal on a top emitting surface of said array to said metal carrier.

2. The method according to claim 1 wherein the said metal carrier is cooled with a cooling liquid.

3. The method according to claim 2 wherein said thermally conductive medium is also electrically conductive to provide a second cathode connection to said carrier.

4. The method according to claim 3 wherein the cathode terminal on the top emitting surface has an associated layer of high conductivity material to improve current spreading.

5. A method of controlling electrical and thermal characteristics of a high density LED printhead comprising:

providing a linear array of surface omitting, planar diffused light emitting diodes having a plurality of p-type islands in n-type semiconductor material and each island having individual p-type electrical contacts;

mounting said linear any directly to a thermally conductive carrier; and providing an n-type contact on said n-type material on the surface emitting face, said n-type contact connected to said carrier by a bond wire.

6. The method as defined in claim 5, wherein said thermally conductive carrier has a continuous passage and a liquid cooling medium is passed through the passage.

7. The method as defined in claim 6, wherein the linear array is mounted to the thermally conductive carrier utilizing an electrically conductive epoxy.

8. The method as defined in claim 6, wherein two or more n-type contacts are provided on the n-type material on the surface emitting face and each connected to the carrier by a bond wire.

9. The method as defined in claim 5, wherein the linear array is provided with a common n-type contact on a face opposite to the surface emitting face.

10. The method as defined in claim 9, wherein the linear array is mounted to the thermally conductive carrier utilizing a thermally conductive epoxy.

* * * * *